(12) United States Patent
Taylor et al.

(10) Patent No.: US 7,246,434 B1
(45) Date of Patent: Jul. 24, 2007

(54) METHOD OF MAKING A SURFACE MOUNTABLE PCB MODULE

(75) Inventors: Craig M. Taylor, Pleasanton, CA (US); David J. Kenny, State College, PA (US)

(73) Assignee: Pericom Semiconductor Corp., San Jose, CA (US)

( * ) Notice: Subject to any disclaimer, the term of this patent is extended or adjusted under 35 U.S.C. 154(b) by 319 days.

(21) Appl. No.: 10/711,869

(22) Filed: Oct. 11, 2004

(51) Int. Cl.
*H01K 3/10* (2006.01)

(52) U.S. Cl. .................... 29/852; 29/830; 29/832; 29/840; 29/846

(58) Field of Classification Search .............. 29/830, 29/832, 840, 846, 852
See application file for complete search history.

(56) References Cited

U.S. PATENT DOCUMENTS

| | | | |
|---|---|---|---|
| 5,074,037 A | 12/1991 | Sutcliffe et al. ............... 29/847 |
| 5,670,750 A | 9/1997 | Lauffer et al. ............... 174/262 |
| 6,104,095 A | 8/2000 | Shin et al. .................... 257/787 |
| 6,134,117 A | 10/2000 | Funk et al. ................... 361/760 |
| 6,137,064 A | 10/2000 | Kiani et al. ................... 174/266 |
| 6,245,490 B1 | 6/2001 | Yoon et al. ................... 430/318 |
| 6,566,166 B2 | 5/2003 | Chien ......................... 438/108 |
| 6,609,297 B1 * | 8/2003 | Hiramatsu et al. ............. 29/852 |
| 6,609,915 B2 | 8/2003 | Adams et al. ................. 439/74 |
| 6,637,641 B1 | 10/2003 | Downes et al. .............. 228/102 |
| 6,759,271 B2 | 7/2004 | Miyazaki .............. 257/E21.506 |
| 6,759,738 B1 | 7/2004 | Fallon et al. ................. 257/700 |
| 6,944,945 B1 * | 9/2005 | Shipley et al. ................. 29/852 |
| 2002/0133943 A1 * | 9/2002 | Sakamoto et al. ............. 29/846 |
| 2003/0040138 A1 * | 2/2003 | Kobayashi et al. .......... 438/112 |
| 2006/0180344 A1 * | 8/2006 | Ito et al. ....................... 174/262 |

OTHER PUBLICATIONS

J-lead Clip Drawing, "Surface Mount Applications". Jun. 9, 2003 ( from http://www.nasinterplex.com/nas_smt/smt61.html ).
SCG2500 Synchronous Clock Generators, Prelim. Data Sheet # SG027, Connor Winfield, pp. 1-10, Mar. 15, 2002.

* cited by examiner

*Primary Examiner*—Carl J. Arbes
(74) *Attorney, Agent, or Firm*—g Patent LLC; Stuart T. Auvinen

(57) ABSTRACT

A printed-circuit board (PCB) module has co-planar solder pads on a bottom surface. The solder pads can be surface-mounted to pads on a main board, allowing the PCB module to be surface mounted without wire leads extending from the PCB module substrate. A cavity is formed between the solder pads on the bottom surface. The cavity is formed by milling away some of the thickness of a sacrificial insulator layer, which is the insulator layer under the solder-pad metal layer. The sacrificial insulator layer can be made thicker to allow for milling the cavity without milling into inner metal layers on the PCB module. After milling away much of the sacrificial insulator layer, stand-offs remain under the solder pads, providing a stand-off gap between the top of the cavity and the solder pads when soldered to the main board. The stand-off gap allows for cleaning under the PCB module.

15 Claims, 11 Drawing Sheets

BOTTOM VIEW

SIDE VIEW

END VIEW

METHOD OF MAKING A SURFACE MOUNTABLE PCB MODULE

This invention relates to electronic packages, and more particularly to a surface-mountable package made with a modified printed-circuit board (PCB) process.

Traditionally, many electronic systems are made by mounting integrated circuit (IC) chips on one or more printed-circuit boards (PCBs). Each individual IC chip is typically packaged in a plastic or ceramic IC package. Pins on the IC package may be fitted into holes in the PCB, or bent package leads or a grid of solder balls on the package may be soldered to flat metal pads on the surface of the PCB.

Some IC packages can have two or more IC chips. Such multi-chip IC packages may have a lead frame surrounding a cavity or die-attach area. Small bonding wires are strung from bonding pads on the die to bonding pads on the lead frame; then the package is sealed to protect the fragile bonding wires.

Leaded chip carriers (LCCs) can also be used for packaging one or more IC chips. LCCs have leads that extend outward from the package edges. The leads may be soldered to pads on a PCB. These leads provide a stand-off gap between the LCC and the PCB it is soldered to. However, making these LCCs is somewhat complex and expensive, initial tooling costs are higher, and there may be limitations for multi-layer configurations.

PCB's can be connected to one another using edge-connector sockets. However, one PCB is usually not soldered directly onto the surface of another PCB without a connector of some kind. Without the leads of a LCC, there would be no stand-off gap between the two PCBs if one PCB were surface-mounted to the other. Cleaning between the PCBs would be problematic, as manufacturing chemicals and debris could be trapped in any small spaces between the two PCBs, perhaps causing electrical failures. Additionally, thermal expansion of any residual/contaminant material remaining between the two PCB's could then cause cracking and failure if PCBs were directly soldered together, in a parallel, surface-mounted position, depending on the board geometry and connection arrangement.

Three-dimensional J-leads can be added to a PCB. However, co-planarity problems exist. Moreover, the solder material used to attach the J-leads to the PCB can melt under board-assembly reflow heating that occurs when attaching to the second PCB, causing the leads to fall off. Expensive hand-soldering or re-working may be required.

What is desired is a PCB module that can be directly soldered onto another PCB. A PCB module made from a modified PCB process is desired that has pads for surface-mounting to a main board PCB. A surface-mountable PCB module with integrated standoffs and surface-mount pads is desirable.

DETAILED DESCRIPTION

The present invention relates to an improvement in surface-mountable PCB modules. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
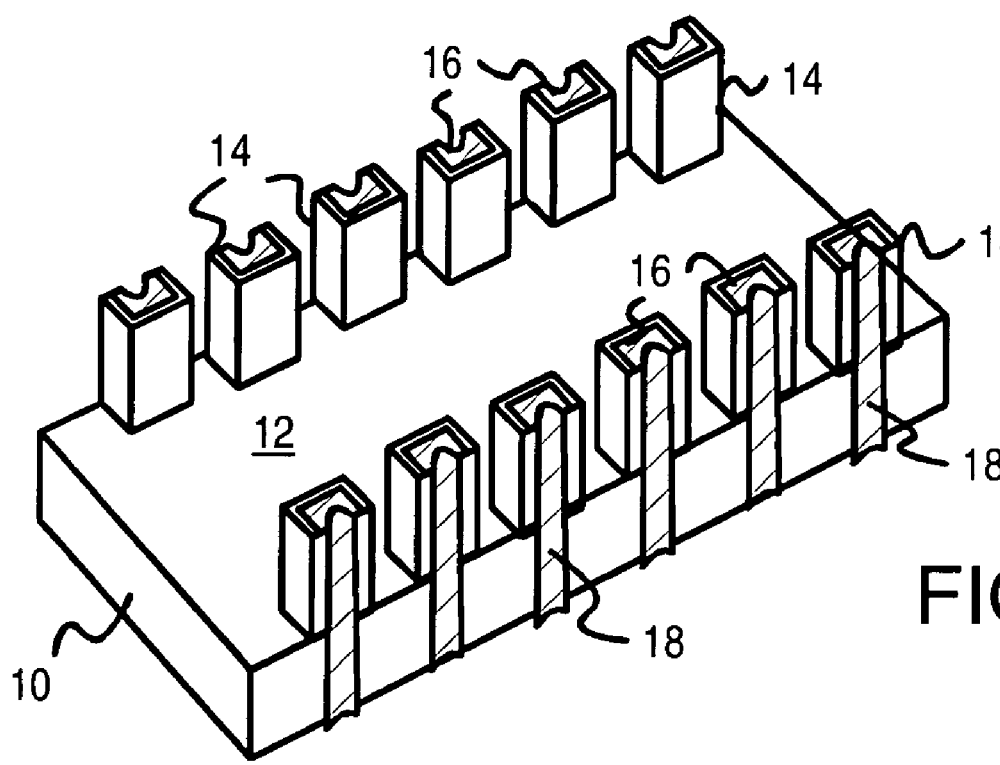
FIG. 1 is a perspective view of an underside of a surface-mountable PCB showing integrated stand-offs having surface-mounting solder pads.

FIG. 1 is a perspective view of an underside of a surface-mountable PCB showing integrated stand-offs having surface-mounting solder pads. PCB module 10 is made using a PCB process and has multiple patterned metal layers and insulating fiberglass-epoxy (or other) layers between the metal layers. IC packages, capacitors, resistors, and other components can be mounted to the top-side of PCB module 10, which is hidden from the under-side (bottom) view of FIG. 1. However, such components are not mounted on the underside of PCB module 10 shown in FIG. 1. Instead, a portion of the last insulator layer is milled away from the underside, forming cavity 12. During milling of cavity 12, portions of the last insulator layer between solder pads 16 are also milled away, leaving pillars of the last insulator layer under each of solder pads 16. These pillars of fiber-epoxy-layer (or other) insulator are stand-offs 14. The last insulator layer is thus a sacrificial insulator layer since large portions of this insulator layer are milled away.

Stand-offs 14 support solder pads 16 above the surface of cavity 12 as seen in this under-side view. When PCB module 10 is flipped over and placed onto a surface of a larger PCB, such as a motherboard PCB, solder pads 16 can touch flat pad areas of the motherboard PCB while cavity 12 is spaced apart from the surface of the motherboard PCB.

Castellation vias 18 are formed by drilling a panel of several PCB modules 10 before separation. The drilled castellation vias 18 are plated with metal, providing electrical connection of solder pads 16 to other metal layers within PCB module 10. During separation of PCB module 10 from other PCB modules in a panel, round castellation vias 18 are split in two, leaving the half-cylinder or half-circle cross-sectional shape of castellation vias 18. Such castellation vias 18 are useful during soldering of solder pads 16 to metal pads on the motherboard PCB, since solder can flow within castellation vias 18, and the solder can be visually inspected to ensure a good solder connection.

Figure 2A:
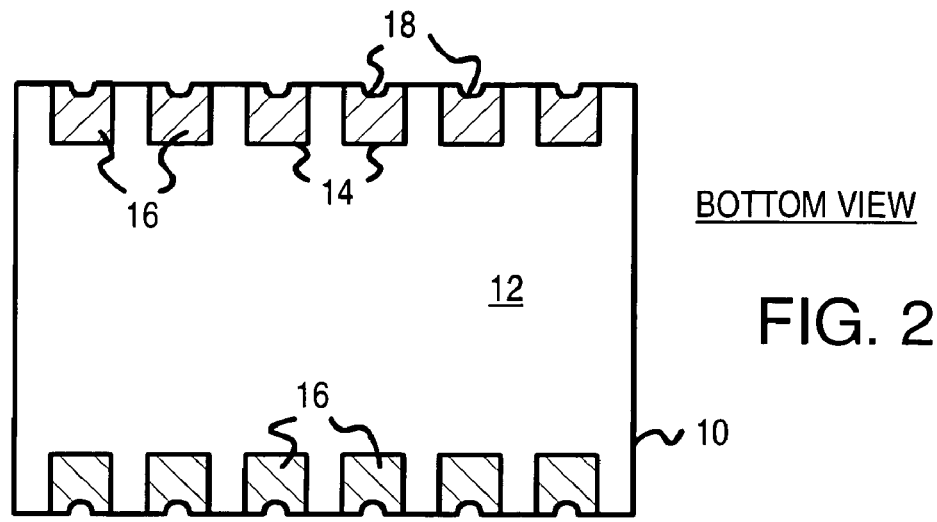
FIG. 2A is a bottom view of the surface-mountable PCB module.

FIG. 2A is a bottom view of the surface-mountable PCB module. The underside surface of cavity 12 is farther away from the viewer than solder pads 16, which are at the top of stand-offs 14 that rise above cavity 12, as seen in FIG. 1. The half-circle cross-sectional shape of castellation vias 18 is seen on the edges of stand-offs 14. Solder pads 16 and metal within castellation vias 18 are electrically connected together.

Figure 2B:
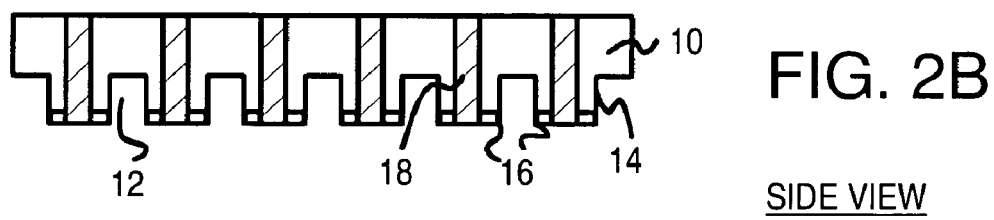
FIG. 2B is a side view of the surface-mountable PCB module.

FIG. 2B is a side view of the surface-mountable PCB module. In this view PCB module 10 is flipped over so that cavity 12 and solder pads 16 face downward. Solder pads 16 may be mounted to metal pads on a motherboard PCB positioned below solder pads 16.

Castellation vias 18 are visible on the edges of PCB module 10. Castellation vias 18 are plated with metal and can connect solder pads 16 to other metal layers within PCB module 10. Stand-offs 14 are separated from each other by extensions of cavity 12, which is formed by milling away the last fiber-epoxy insulator layer. This last fiber-epoxy insulator layer can be made thicker than other insulator layers to increase the stand-off distance provided by stand-offs 14, allowing cavity 12 to be deeper.

Figure 3:
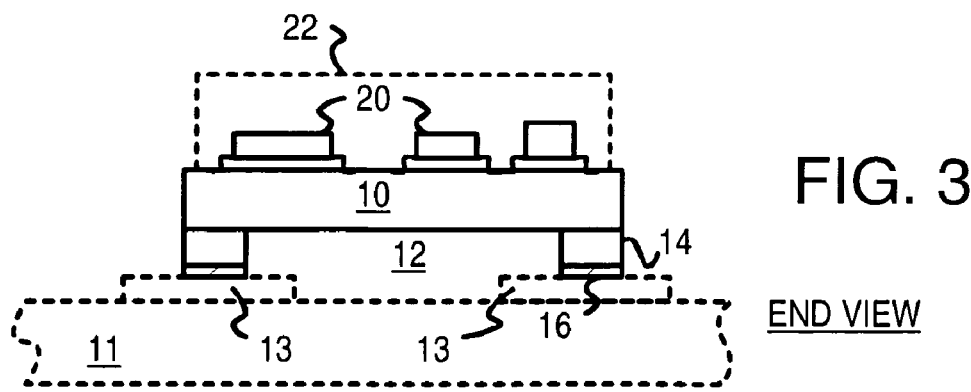
FIG. 3 is an end view of the surface-mountable PCB module.

FIG. 3 is an end view of the surface-mountable PCB module. In this view PCB module 10 is flipped over so that cavity 12 and solder pads 16 face downward. Solder pads 16 may be mounted to metal pads 13 on motherboard PCB 11 positioned below solder pads 16. A gap spacing the surface of motherboard PCB 11 and the surface of cavity 12 in PCB module 10 is provided by stand-offs 14.

Components 20 are IC packages, capacitors, resistors, or other mountable components. Components 20 are mounted onto the top surface of PCB module 10, such as by surface-mounting of package leads. Cover 22 can be placed over components 20 to protect components 20, or components 20 may be left exposed.

Figure 4A:
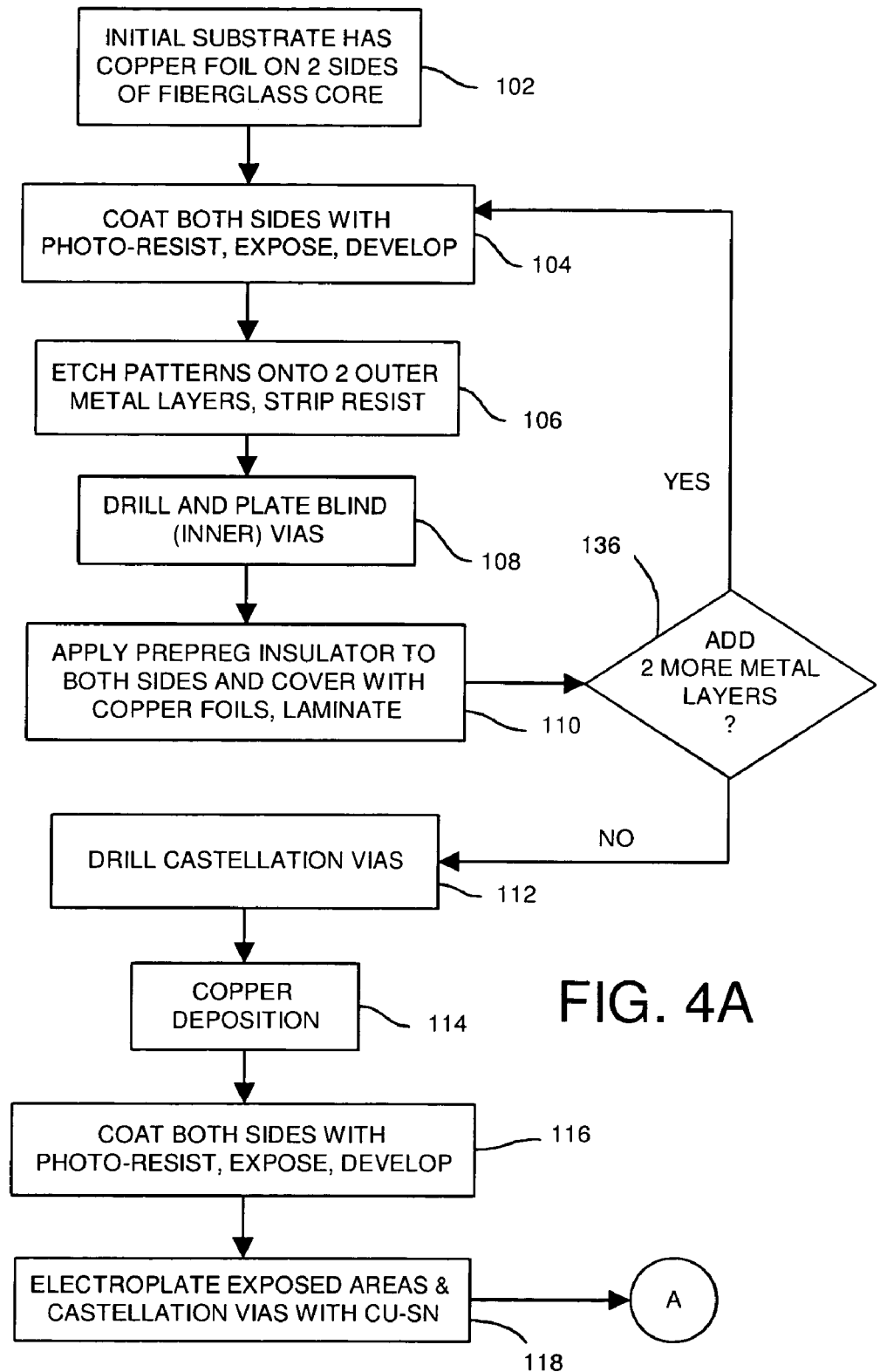
FIGS. 4A-B are flowcharts of a modified PCB process to make a surface-mountable PCB module.
Figure 4B:
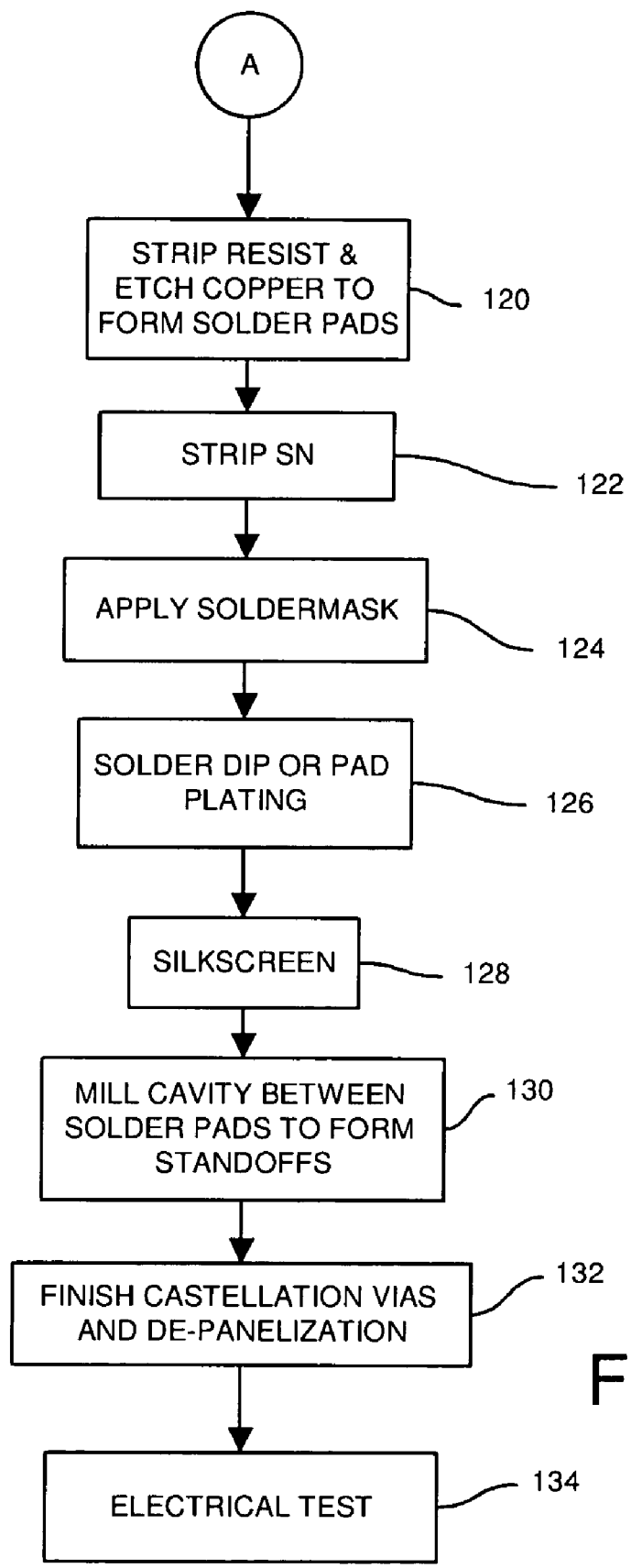

FIGS. 4A-B are flowcharts of a modified PCB process to make a surface-mountable PCB module. In FIG. 4A, initial substrate 102 has a fiber-epoxy insulator core with copper foil or sheets on the two flat surfaces of the initial substrate. Such an initial substrate could be formed by laminating copper foil onto the surfaces of a fiber-epoxy core, but such initial substrates can be more easily purchased.

Both sides of initial substrate 102 are coated with photoresist, which is exposed with a pattern and developed to cover some of the areas of the copper foil, step 104. An etchant is prevented from etching portions of the copper foil that are covered with resist, while areas without resist are etched away, step 106. After the resist is stripped or removed, the metal is patterned into traces for the middle metal layers.

Inner or blind vias are drilled at pre-determined locations, step 108, and these vias are plated with metal, forming electrical connections between traces on the two inner metal layers, step 108.

An insulator, such as a prepreg epoxy, is applied to both sides of the substrate over the patterned inner metal layers, step 110. Copper foil sheets are then placed over the applied insulator layers and pressed together and laminated with heat to cure the insulator epoxy and firmly attach the metal foil layers.

This produces a "4-layer" board that has 4 metal layers and 3 insulator layers. Sometimes a 6-layer or an 8-layer (or more) PCB is required, such as when there is complex interconnect or a very small-area board. When extra layers are needed, step 136, then steps 104 to 110 are repeated until the desired number of layers is built up.

Once all the metal layers are formed, the castellation vias are drilled, step 112. The castellation vias are drilled on the edge of the PCB module, crossing into the de-panelization (scribe) or dividing area between PCB modules on a panel. Many PCB modules can be made together on one panel and later separated to improve productivity.

Copper is deposited onto the outer metal layers, step 114. Both sides of the modules are then coated with resist, exposed, and developed to form patterns, step 116. The exposed areas not covered by resist are electroplated with copper and then with tin, step 118. The exposed areas include the castellation vias, so the interior walls of the castellation vias are plated with metal.

Continuing in FIG. 4B, the resist is removed, leaving areas of copper without tin under the areas formerly covered by resist, and areas of tin and copper in areas that were exposed. The tin acts as a barrier preventing etching of copper-tin areas, allowing just the pure copper areas to be etched away, step 120. Thus copper-metal areas formerly covered by resist are removed. The protecting tin layer is then stripped off, step 122, leaving patterned copper layers on both sides of the substrate.

Another resist layer is applied, exposed, developed and cured, soldermask 124. Exposed areas of metal are covered with a prescribed metal finish, step 126, such as by dipping the board in solder or plating or depositing metal on the exposed pad areas. Silk-screen process 128 is used to print markings on the surfaces, such as letter and numbers of components, etc.

In many PCB processes, a drill or cutting bit is used to drill vias and to cut the scribe or depanelization lines between PCB modules to separate modules from the panel. A computer file controls movements of the drill bit, such as x,y,z motions. The drill bit can be moved to the x,y position of a desired via, then the drill bit is lowered into the board to drill the via, and then raised to be moved to the next via position. For cutting the depanelization area, the drill can be moved while in the down position, acting as a router bit. The machine used to drill/route in steps 130, 132 may be the same machine. The milling machine may have a multi-bit tool head that allows selection of different bit sizes (in case via diameters are different) and/or type (drill, route, or mill). Separate machines could also be used.

Milling step 130 uses a router/drilling machine to form cavity 12 and stand-offs 14. Some drill machines allow for fairly precise control of the z position. The bit may be partially lowered so that it does not completely penetrate the PCB. With the underside facing upward toward the drill bit, the drill bit is lowered so that it cuts into the sacrificial insulator layer but not into the metal layer under the sacrificial insulator layer. The x,y position is then changed, moving the bit to carve away portions of the last insulating layer. The drill machine sequences through x,y positions in between the solder pads to form the stand-offs around the solder pads, and cavity 12. Milling away of part of the thickness of the sacrificial insulator layer leaves some of this insulator layer under cavity 12 to protect the next inner metal layer. Portions of the sacrificial insulator layer that are not milled away form stand-offs 14.

The drilling machine is also used to finish the castellation vias and to cut the de-panelization lines to separate PCB modules from the panel of many PCB modules, step 132. De-panelization and castellation via finishing can be performed one the same drilling or milling machine as step 130, and can be performed at the same time. The edges of the castellation vias are cleared of any burrs or rough edges to finish the castellation vias. The shape of the castellation vias can be smoothed to have a cross-sectional shape that is an arc of less than 180 degrees (not a full half-circle). After de-panelization, the separated PCB modules are electrically tested, step 134 to sort out defective modules. Each PCB module can be placed onto a motherboard PCB and soldered onto the larger PCB as a component board or daughter-card.

Figure 5A:
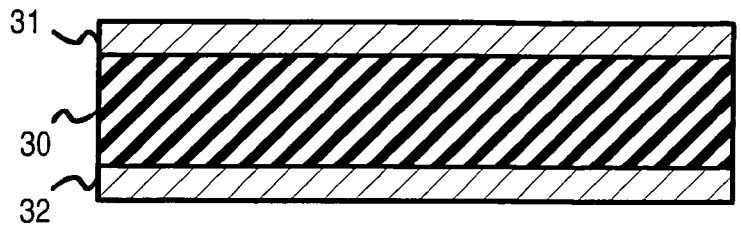
FIGS. 5A-E show initial steps in a process to make surface-mountable PCB modules.

FIGS. 5A-E show initial steps in a process to make surface-mountable PCB modules. In FIG. 5A, a starting substrate has insulator core 30 with attached metal foil sheets that form inner metal layers 31, 32.

Figure 5B:
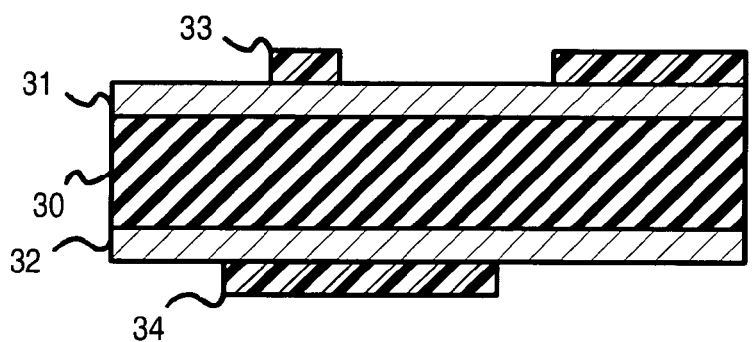
Figure 5C:
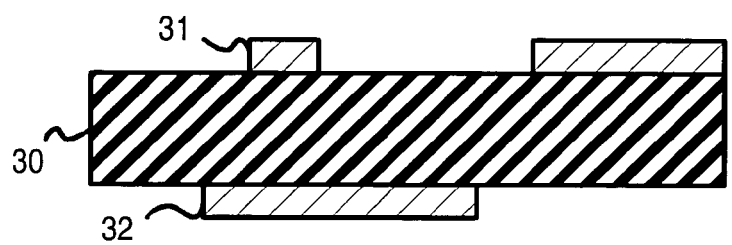

Resist is applied in FIG. 5B and exposed and developed to form patterns in resist layers 33, 34. The areas of resist layers 33, 34 that remain and cover inner metal layers 31, 32 prevent etching of portions of inner metal layers 31, 32 that form metal interconnect traces, as shown in FIG. 5C after the resist is removed.

Figure 5D:
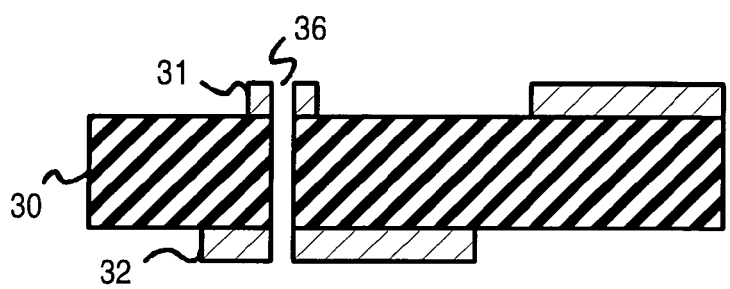

In FIG. 5D, inner or blind vias are drilled, allowing for connecting between inner metal layers 31, 32. For example, blind via 36 is drilled between metal pads on inner metal layers 31, 32. These blind vias 36 are later covered over with insulator and are not visible from the surfaces of the finished PCB module.

Figure 5E:
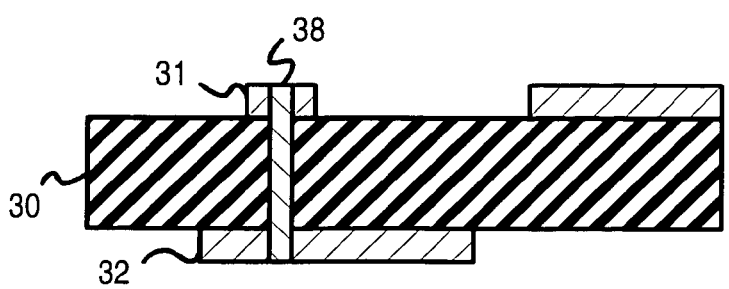

In FIG. 5E, blind vias 36 are electro-plated with metal, forming an electrical connection between inner metal layers 31, 32 through the plated metal on the walls of blind vias 36. Plating or via metal may not completely fill the vias, or the vias may be completely filled.

Figure 6A:
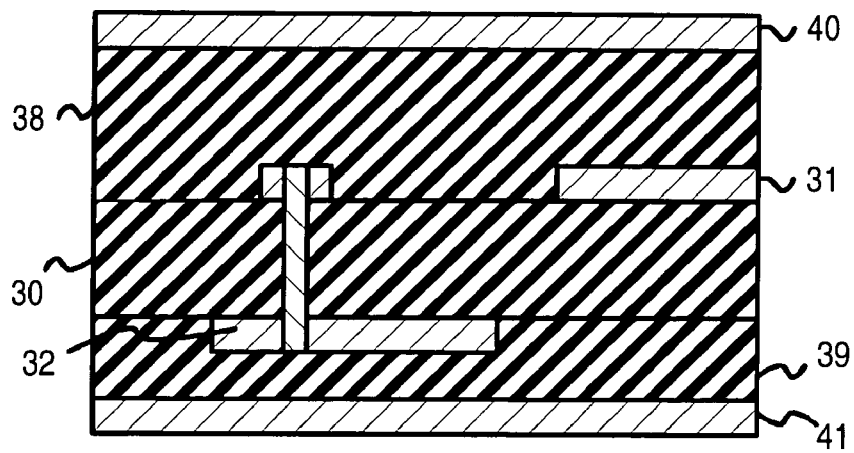
FIGS. 6A-B show steps for laminating and drilling of castellation vias.
Figure 6B:
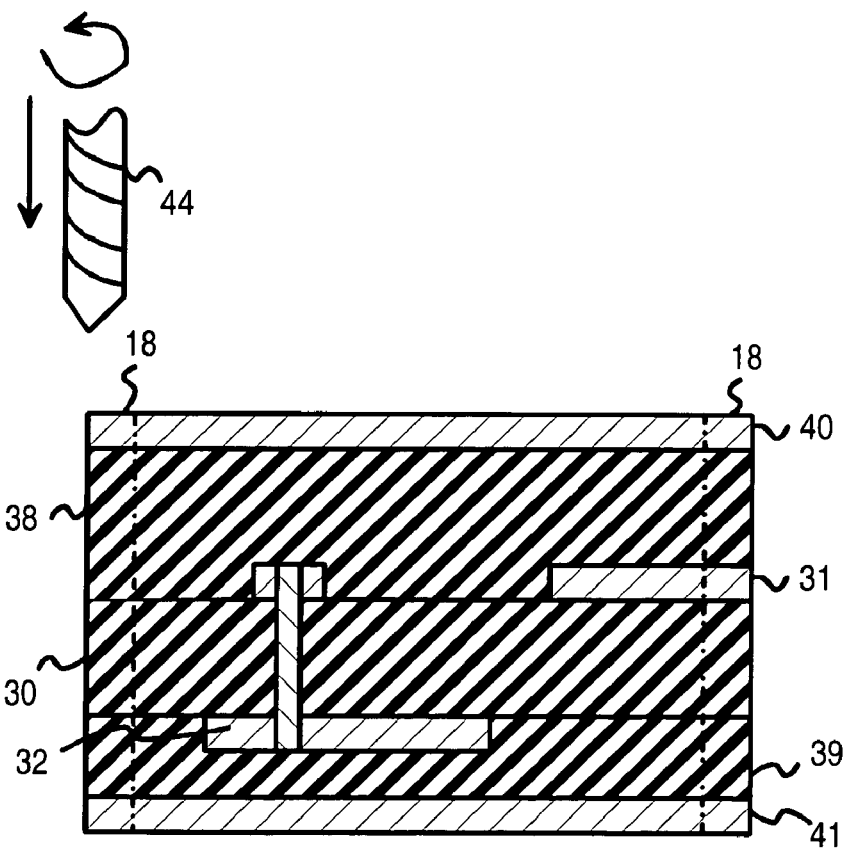

FIGS. 6A-B show steps for laminating and drilling of castellation vias. Insulator, such as glass-epoxy prepreg is applied to both sides of the substrate of FIG. 5E to cover the patterned inner metal layers 31, 32. This forms insulator layers 38, 39. Metal sheets such as copper foil are applied over the epoxy, and the board is laminated to add sacrificial insulator layer 38 and pad metal layer 40 over inner metal layer 31, and to add insulator layer 39 and component-side metal layer 41 over inner metal layer 32.

In FIG. 6B, drill bit 44 is positioned over the substrate and lowered through all layers of the board to drill out castellation vias 18. Castellation vias 18 are located at the edge of each PCB module at the edge of the de-panelization line that separates adjacent PCB modules from each other on a panel of many PCB modules. Only one PCB module is shown in these Figures so castellation vias 18 appear on the edge of the PCB module shown.

Copper may also be deposited on both sides over the copper foil, if necessary or desired. This corresponds to step 114 of FIG. 4A.

FIGS. 7A-G show final steps in a process to make surface-mountable PCB modules. The board with drilled castellation vias 18 from FIG. 6B has resist applied to both sides. The resist is exposed and developed to form patterns in resist layers 46, 47. The exposed areas on at least one side or on both sides include castellation vias 18.

Figure 7A:
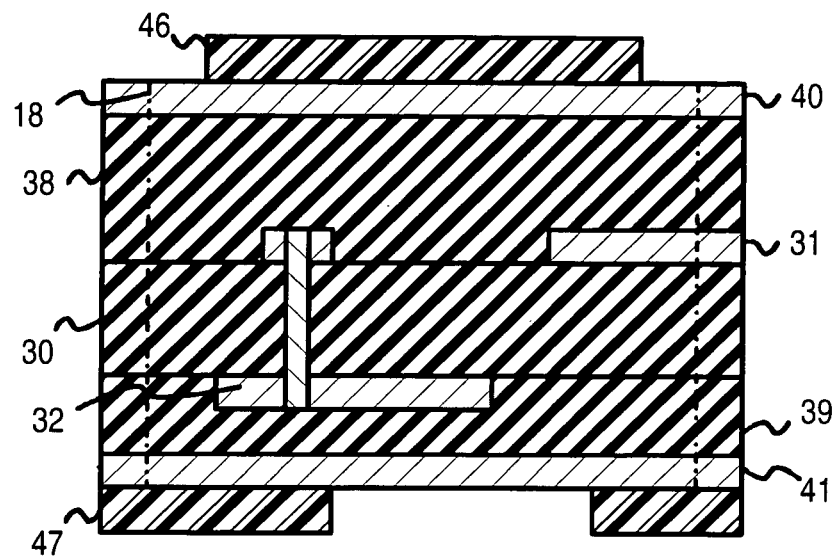
FIGS. 7A-G show final steps in a process to make surface-mountable PCB modules.
Figure 7B:
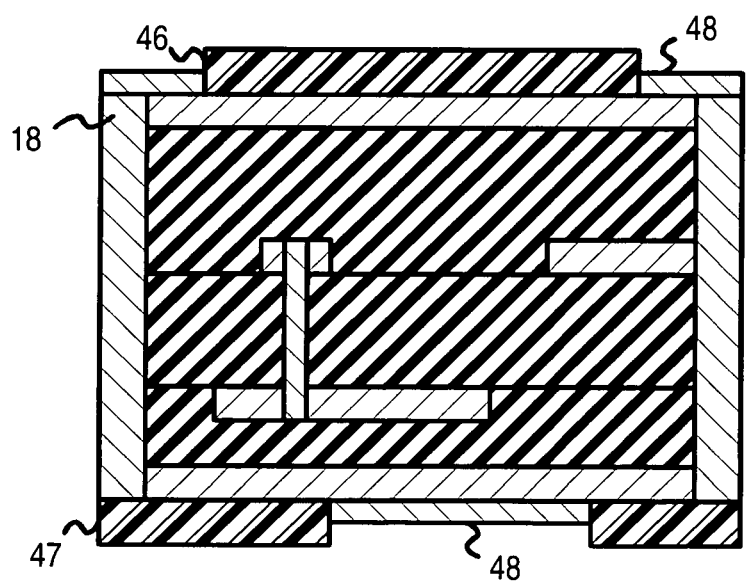

Electroplating places a layer of copper and then a layer of tin over the exposed areas. Since castellation vias 18 are exposed. metal is also plated into castellation vias 18. FIG. 7B shows tin layer 48 covering areas exposed by resist layers 46, 47, and metal inside castellation vias 18.

Figure 7C:
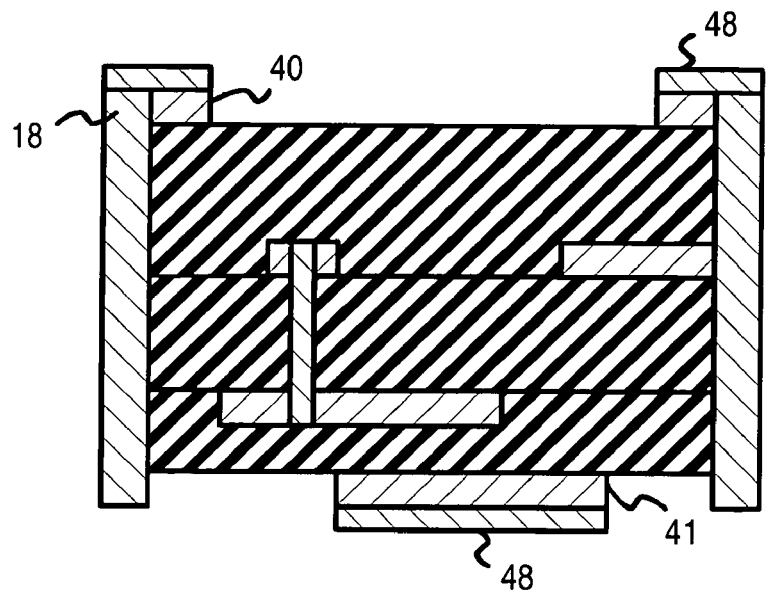

The remaining areas of resist layers 46, 47 are removed. Areas under resist layers 46, 47 are exposed and do not have tin layer 48 over them. These areas of pad metal layer 40 and component-side metal layer 41 without a covering of tin layer 48 are etched away, as shown in FIG. 7C.

Figure 7D:
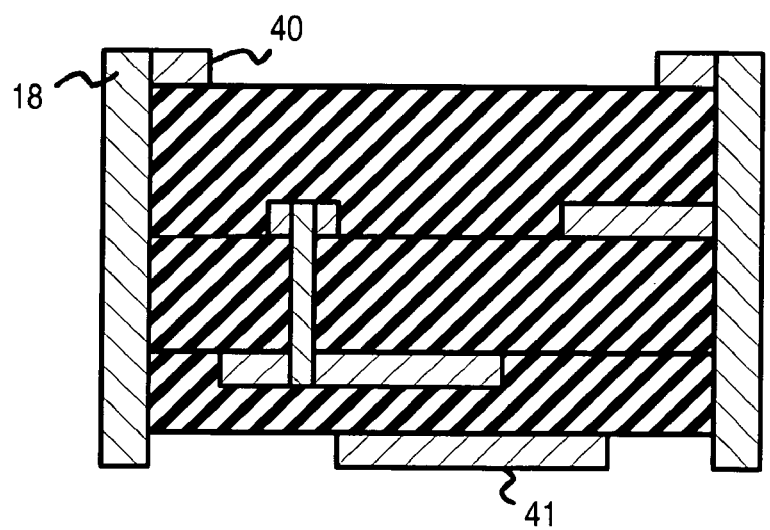
Figure 7E:
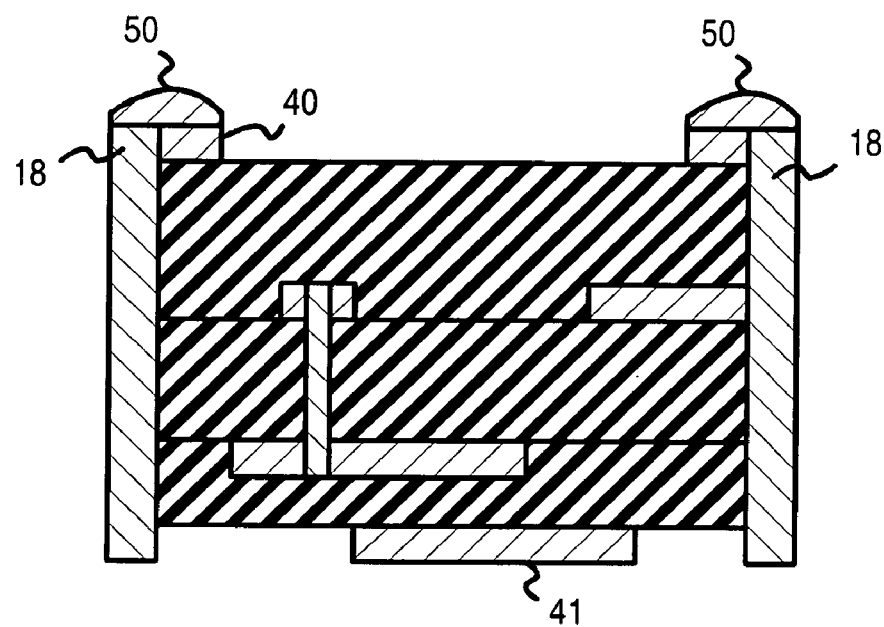

Tin layer 48 is then stripped off using an etchant that removes tin but does not remove copper, leaving the board shown in FIG. 7D. A soldermask is applied and the board is dipped in solder, or plated, to place pad solder 50 onto pad areas which are the openings in the soldermask. Plating or pad solder 50 is placed onto solder pads 16 in pad metal layer 40, and onto component pads on component-side metal layer 41.

Figure 7F:
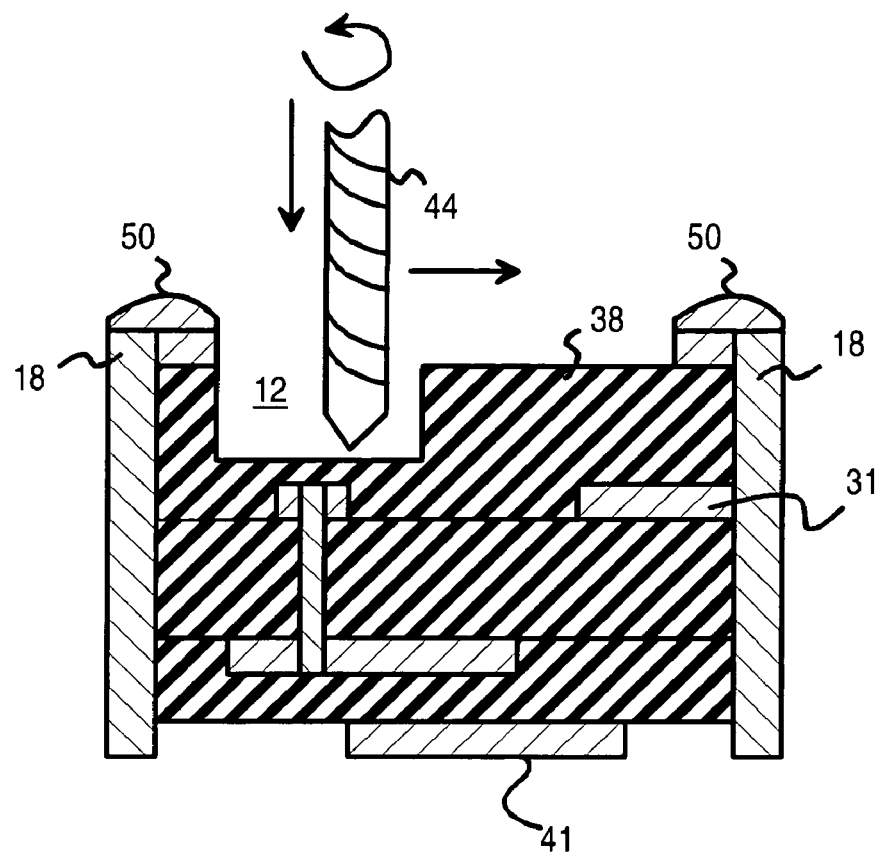

Milling of cavity 12 to form stand-offs 14 occurs in FIG. 7F. Drill bit 44 is positioned over the board and partially lowered into sacrificial insulator layer 38. The depth of drill bit 44 is not sufficient to reach inner metal layer 31 under sacrificial insulator layer 38. Once lowered, drill bit 44 is moved in the x,y direction to mill away portions of sacrificial insulator layer 38, forming cavity 12.

Sacrificial insulator layer 38 can be made thicker than otherwise necessary to allow for less precision in the lowering of drill bit 44. Alternately, the pattern of inner metal layers 31 may be modified to prevent any traces of metal from being under cavity 12, allowing drill bit 44 to penetrate deeper, into insulator core 30.

Figure 7G:
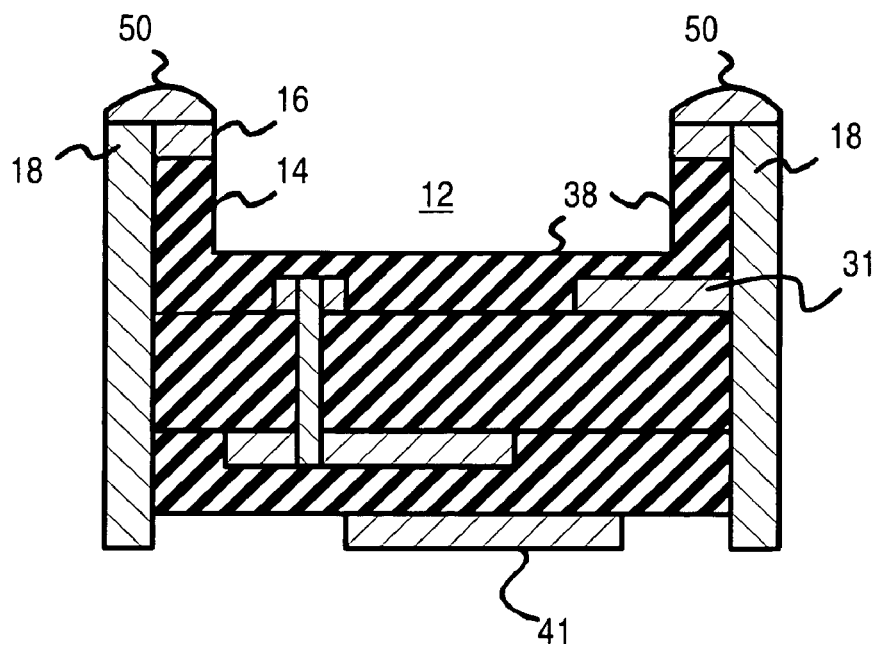

Areas of sacrificial insulator layer 38 that are not milled away form stand-offs 14 under solder pads 16 once milling is complete, as shown in FIG. 7G. Drill bit 44 can then be used to cut the de-panelization or separation lines between PCB modules on the panel (de-panelization) and finish castellation vias 18 by removing any burrs or by smoothing the cut edges of castellation vias 18.

Figure 8:
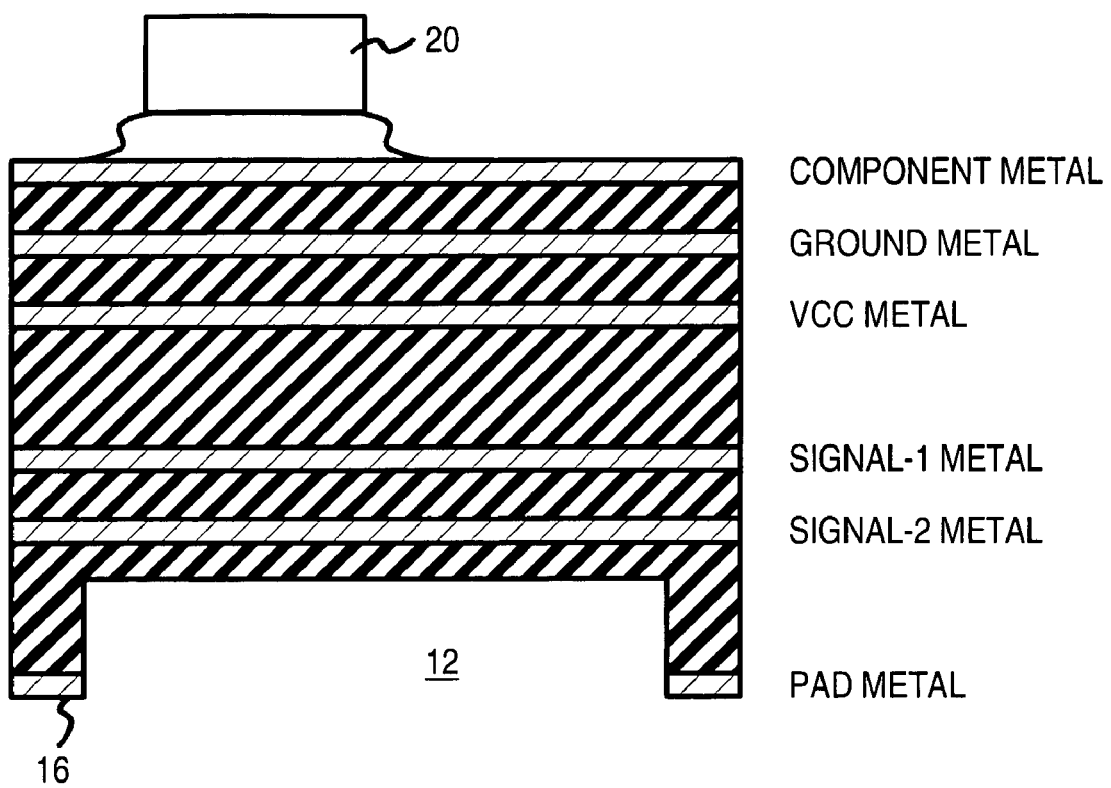
FIG. 8 is a cross-section of a surface-mountable PCB module with additional metal layers.

FIG. 8 is a cross-section of a surface-mountable PCB module with additional metal layers. Six metal layers are formed in the PCB, rather than just 4 as shown in the simpler example process of FIGS. 5-7. The top metal layer is the component metal layer and has metal pads formed thereon for soldering to metal leads of components 20 mounted to the upper surface. These top-layer pads are connected by metal traces patterned in the layer to castellation vias on the edges, or to other vias within the module for electrical connection to other metal layers.

Other metal layers are patterned and carry mostly power and ground traces. These are known as the power and ground layers or planes. Two more internal metal layers are patterned and used to carry various signals. These are signal interconnect metal layers. The bottom-most metal layer is the pad layer that has solder pads 16. Cavity 12 is formed by milling away part of the final insulator layer, leaving stand-offs 14 as well as a portion of the final insulator layer protecting the signal-2 metal layer.

A relatively simple extension to the standard PCB process can produce a surface-mountable PCB module. The step of milling cavity 12 to form stand-offs 14 can be performed on the same drilling machine used for de-panelization or on a separate milling machine. A relatively low-cost method to modify a PCB process to produce surface-mounting pads and stand-offs to prevent failures due to thermal mis-match can be provided.

The stand-off process can create a connection interface that is precisely co-planar. This allows for the sub-assembly to be used in standard automated pick and place/assembly reflow operations. The stand-off gap may also allow for placement of additional components in the cavity under the stand-off board.

ALTERNATE EMBODIMENTS

Several other embodiments are contemplated by the inventors. For example rather than use copper for the metal layers, some or all of the layers could use other metals, such as a copper alloy, aluminum, or other conducting metal. The insulator layers could be fiberglass-epoxy, or could be some other insulator such as BT (bismaleimide/triazine) laminate, a higher Tg material that is somewhat stronger and more resilient than normal fiberglass-epoxy laminate. Different layers could use different materials. Additional process steps could be added for various reasons, such as to add special features to the PCB module. For example, internal resistors or capacitors could be formed by more complex PCB processes. Protective coatings could be added, or a cover attached. Grips or features for automated handling equipment could be added. Cavities could be formed on both the top and on the bottom sides. The cavity on the top side could then be used for recessing components. In its simplest form, the process can produce a 2-layer board. Traces on the top layer have vias to connect to pads on the back side for connectivity and allow the milling away of material on the back side to form a standoff board.

The order of the steps can be varied in many different ways. For example, the castellation vias may be drilled at a different point in the process, such as closer to the end. The standoff boards could be formed with no castellations. The pad geometries and number of interconnect vias could change in relationship to that. The milling of the cavity could also be done at a precision machine shop, instead of at a PCB fabricator.

Rather than use half-vias on the edge of the PCB module, vias within the PCB module 10 could connect solder pads 16 with inner metal layers. Other castellation vias could be drilled that do not connect to any of solder pads 16, but are used for interconnect of other metal layers.

The thickness of various layers can vary substantially. The core insulator could be quite thick for support, while other insulator layers are thinner or vary in thickness. The sacrificial insulator layer could be thicker than all other insulator layers or thicker than all layers except the core, or could have the same thickness as other insulator layers when a milling machine with sufficient precision in the depth movement is available. Markings from movement of the milling bit may be visible within cavity 12, such as a serpentine pattern, and the depth of cavity 12 may vary or even be terraced. Gaps between adjacent stand-offs 14 may be eliminated in some embodiments, especially when relatively few pads are needed. Multiple solder pads could be located on each stand-off, or rows of solder pads could be located on elongated stand-offs. Applications which require larger boards may incorporate either individual pads or rows of pads for mechanical support in the center.

Metal deposition rather than electroplating may be performed for some steps. Dummy traces in the de-panelization lines may connect metal features that are to be plated while non-plated areas are not connected to the dummy lines. The dummy lines can then be connected to a voltage source during electro-plating.

Solder pads 16 may have various shapes and their surface may not be flat, but have raised portions such as from blobs of solder on the pads. However, the pads are relatively flat when compared to leads extending from a leaded chip carrier. Positive or negative resist may be used with appropriate modifications, and other kinds of resist that are not photo-sensitive, such as electron-beam resist may be used.

The gap created by the standoffs and cavity can allow for cleaning underneath the PCB module. Solder pads may be located on two opposing sides of the cavity as shown in the drawings, or may be located on 1, 3 or 4 sides. Larger spacing between adjacent solder pads or channels can allow for cleaning the cavity. The motherboard PCB may be a daughter card, bus card, or some other kind of PCB or mountable substrate.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A manufacturing process for making a surface-mountable printed-circuit board (PCB) module comprising:
    etching inner metal layers on both sides of an insulating core to form patterned interconnect on the inner metal layers;
    laminating a component metal sheet and a component insulator layer over one of the inner metal layers;
    laminating a pad metal sheet and a sacrificial insulator layer over another one of the inner metal layers;
    etching the component metal sheet to form patterned component-layer interconnect from the component metal sheet;
    etching a pad metal layer of the pad metal sheet to form solder pads from the pad metal sheet;
    drilling castellation vias on the pad metal layer, and forming metal inside the castellation vias that connect the pad metal layer to the patterned component-layer interconnect or the patterned interconnect on the inner metal layers;
    milling a cavity into the sacrificial insulator layer, the cavity not reaching the patterned interconnect on the inner metal layers; and
    wherein the sacrificial insulator layer covered by the solder pads forms a plurality of stand-offs after milling, whereby the solder pads on the stand-offs are surface-mountable to a main board.

2. The manufacturing process of claim 1 further comprising:
    milling the sacrificial insulator layer between adjacent solder pads to further form the plurality of stand-offs.

3. The manufacturing process of claim 2 wherein drilling castellation vias is performed before etching the pad metal layer to form the solder pads.

4. The manufacturing process of claim 2 wherein drilling castellation vias is performed after etching the pad metal layer to form the solder pads.

5. The manufacturing process of claim 1 wherein etching the pad metal layer to form solder pads from the pad metal sheet comprises:
    plating copper and tin on exposed areas of the pad metal sheet;
    removing resist from covered areas of the pad metal sheet;
    wherein exposed areas have a tin over copper while covered areas have no tin over the copper;
    etching copper from the covered areas but not etching copper from the exposed areas protected by tin; and
    removing tin covering copper in the exposed areas to form the solder pads.

6. The manufacturing process of claim 1 further comprising:

applying a solder mask to the solder pads with openings over each of the solder pads;

applying solder to the openings in the solder mask to apply solder to the solder pads; and removing the solder mask.

7. The manufacturing process of claim 1 further comprising:

de-panelization by cutting de-panelization lines between adjacent PCB modules on a panel having a plurality of the PCB modules being formed together.

8. The manufacturing process of claim 7 wherein the castellation vias are formed along the de-panelization lines, wherein each castellation via is partly in one of the de-panelization lines and partly on one of the solder pads.

9. The manufacturing process of claim 8 further comprising:

finishing the castellation vias during de-panelization by rounding or smoothing edges of the castellation vias.

10. The manufacturing process of claim 9 wherein milling the cavity is performed along with de-panelization on a same machine.

11. The manufacturing process of claim 1 wherein milling the cavity is performed by moving a rotating drill or router bit over the sacrificial insulator layer to cut away a portion of the sacrificial insulator layer.

12. The manufacturing process of claim 11 wherein the sacrificial insulator layer is thicker than the component insulator layer.

13. The manufacturing process of claim 11 further comprising:

drilling inner vias between the inner metal layers and plating the inner vias to form inter-layer interconnect between the inner metal layers.

14. The manufacturing process of claim 13 further comprising:

mounting and soldering components to the patterned component-layer interconnect, wherein the components are integrated circuits and capacitors or resistors.

15. The manufacturing process of claim 14 further comprising:

surface-mounting the PCB module to a main board by placing the solder pads over pad metal areas of the main board and heating to solder the solder pads to the pad metal areas.

* * * * *